United States Patent
Phares et al.

(10) Patent No.: US 10,070,526 B2
(45) Date of Patent: Sep. 4, 2018

(54) CONNECTOR WITH STRUCTURES FOR BI-LATERAL DECOUPLING OF A HARDWARE INTERFACE

(71) Applicant: Intel Corporation, Santa Clara, CA (US)

(72) Inventors: Charles C. Phares, Federal Way, WA (US); Kevin J. Ceurter, Olympia, WA (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 15/201,312

(22) Filed: Jul. 1, 2016

(65) Prior Publication Data

US 2018/0007788 A1    Jan. 4, 2018

(51) Int. Cl.
| | |
|---|---|
| *H05K 1/14* | (2006.01) |
| *H01R 12/70* | (2011.01) |
| *H05K 5/00* | (2006.01) |
| *H05K 5/02* | (2006.01) |
| *H01R 12/73* | (2011.01) |

(52) U.S. Cl.
CPC ......... *H05K 1/148* (2013.01); *H01R 12/7076* (2013.01); *H01R 12/737* (2013.01); *H05K 5/0004* (2013.01); *H05K 5/0017* (2013.01); *H05K 5/0069* (2013.01); *H05K 5/0217* (2013.01)

(58) Field of Classification Search
CPC ........ H01R 12/82; H01R 13/62; H01R 24/00; H01R 13/06
USPC .......................... 439/327, 328, 65, 326, 325
See application file for complete search history.

(56) References Cited

U.S. PATENT DOCUMENTS

| | | | |
|---|---|---|---|
| 3,920,302 A | 11/1975 | Cutchaw | |
| 4,511,950 A * | 4/1985 | Bunner | H05K 1/0263 361/788 |
| 4,842,538 A | 6/1989 | Noschese | |
| 6,273,759 B1 * | 8/2001 | Perino | H01R 12/716 439/631 |
| 6,503,093 B1 * | 1/2003 | Sakata | H01R 12/721 439/160 |

(Continued)

OTHER PUBLICATIONS

International Search Report and Written Opinion for PCT Appln. No. PCT/US2017/030658, dated May 2, 2017, 12 pgs.

*Primary Examiner* — Alexander Gilman
(74) *Attorney, Agent, or Firm* — Womble Bond Dickinson (US) LLP (57) ABSTRACT

Techniques and mechanisms to provide a connector for securing to a first printed circuit board (PCB). In an embodiment, the connector is configured to receive a second PCB, where a first hardware interface of the connector includes conductors to facilitate bilateral decoupling from (and coupling to) respective hardware interfaces of the first PCB and the second PCB. A first conductor of the first hardware interface includes a first portion configured to move, relative to a housing structure of the connector, in response to the connector receiving a portion of a device which comprises the second PCB. A second portion of the first conductor is configured to be brought into contact with a conductive pad of the device. In another embodiment, the connector includes housing structures configured to move relative to one another while the connector is secured to the first PCB.

17 Claims, 8 Drawing Sheets

(56) References Cited

U.S. PATENT DOCUMENTS

| | | | |
|---|---|---|---|
| 6,969,261 B2* | 11/2005 | Harris | H01R 12/7088 439/65 |
| 7,366,423 B2* | 4/2008 | Levy | G02B 6/4201 398/164 |
| 7,488,192 B1 | 2/2009 | Eagle et al. | |
| 7,520,781 B2* | 4/2009 | Clayton | H01R 12/721 257/686 |
| 7,539,024 B1 | 5/2009 | Karabatsos | |
| 7,682,179 B1* | 3/2010 | Tsai | H05K 7/16 439/326 |
| 7,814,379 B2* | 10/2010 | Lee | G01R 31/318505 324/762.06 |
| 8,535,076 B2* | 9/2013 | Okamura | H01R 13/62 439/325 |
| 8,734,176 B2* | 5/2014 | Ishimaru | H01R 12/774 439/328 |
| 2004/0048518 A1* | 3/2004 | Ruckerbauer | H01R 12/52 439/631 |
| 2004/0121655 A1 | 6/2004 | Ling et al. | |
| 2005/0009396 A1* | 1/2005 | Wu | H01R 12/7005 439/327 |
| 2008/0096412 A1* | 4/2008 | Poh | H01R 13/645 439/326 |
| 2011/0097913 A1* | 4/2011 | Fu | H01R 12/7005 439/153 |
| 2012/0007625 A1* | 1/2012 | Kim | H01R 12/87 324/756.01 |
| 2012/0100742 A1* | 4/2012 | Ishimaru | H01R 12/61 439/345 |
| 2012/0178276 A1* | 7/2012 | Lee | H01R 12/7005 439/327 |
| 2012/0214329 A1* | 8/2012 | Ishimaru | H01R 12/79 439/350 |

\* cited by examiner

CONNECTOR WITH STRUCTURES FOR BI-LATERAL DECOUPLING OF A HARDWARE INTERFACE

BACKGROUND

1. Technical Field

This invention relates generally to interconnect systems, and more specifically to a connector for providing interconnection with a printed circuit board.

2. Background Art

Double data rate (DDR) synchronous dynamic random access memory (SDRAM) was introduced as an evolutionary dynamic random access memory (DRAM) to provide a high-performance interface for system memory. In a typical computer platform, memory devices (e.g., SDRAM) are mounted on a dual in-line memory module (DIMM). The DIMM is then plugged into a motherboard via a DIMM connector to provide an interface between the memory and the motherboard.

In various computing technologies, such as those using a DIMM, a PCI Express card, a blade server or the like, a connector is used to couple a first printed circuit board (PCB) edgewise to the surface of a second PCB. The connector is typically coupled to a bus of the second PCB, where the bus facilitates high data rate communication between the first PCB and other components disposed on, or otherwise coupled to, the second PCB.

The performance of a high speed bus tends to be sensitive to signal noise. As the number, variety and capabilities of signaling technologies continue to grow, high-frequency phenomena, such as channel resonance, inter-symbol interference (ISI), cross-talk, and simultaneous switching noise (SSN), become more critical to system performance. Consequently, there is expected to be a greater premium placed on incremental improvements in hardware to facilitate interconnection between printed circuit boards.

BRIEF DESCRIPTION OF THE DRAWINGS

The various embodiments of the present invention are illustrated by way of example, and not by way of limitation, in the figures of the accompanying drawings and in which.

DETAILED DESCRIPTION

Embodiments discussed herein variously provide interface techniques and/or mechanisms to facilitate connectivity with a printed circuit board (PCB). A hardware interface of a connector according to an embodiment may include one or more conductors—e.g., including respective straight, curved or angled pin structures—that are variously configured each to couple to a corresponding input/output (TO) contact of another hardware interface at a PCB.

Some embodiments are based on a realization by the inventors that conductors in conventional connector are designed to be fixedly coupled to a printed circuit board, and that such fixed coupling may result in sources of signal noise under some conditions. For example, conductors of a conventional connector are often fixedly coupled to a shared bus of a PCB, where the shared bus is further coupled to multiple hardware interfaces disposed on the PCB. The shared bus may support communications among the other hardware interfaces at a time when the conventional connector is not being used (e.g., when no other device is coupled to the bus via the conventional connector). In such a scenario, unused conductors of the conventional connector tend to reflect signal components of the communications, thereby degrading the integrity of communications on the shared bus. Some embodiments avoid such signal noise by decoupling conductors of a connector from a PCB, while housing and/or other structures of the connector remain connected to that PCB.

The technologies described herein may be implemented in one or more electronic devices. Non-limiting examples of electronic devices that may utilize the technologies described herein include any kind of mobile device and/or stationary device, such as cameras, cell phones, computer terminals, desktop computers, electronic readers, facsimile machines, kiosks, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. In some embodiments the technologies described herein may be employed in a desktop computer, laptop computer, smart phone, tablet computer, netbook computer, notebook computer, personal digital assistant, server, combinations thereof, and the like. More generally, the technologies described herein may be employed in any of a variety of electronic devices including a connector that provides coupling/decoupling functionality such as that variously described herein.

Figure 1:
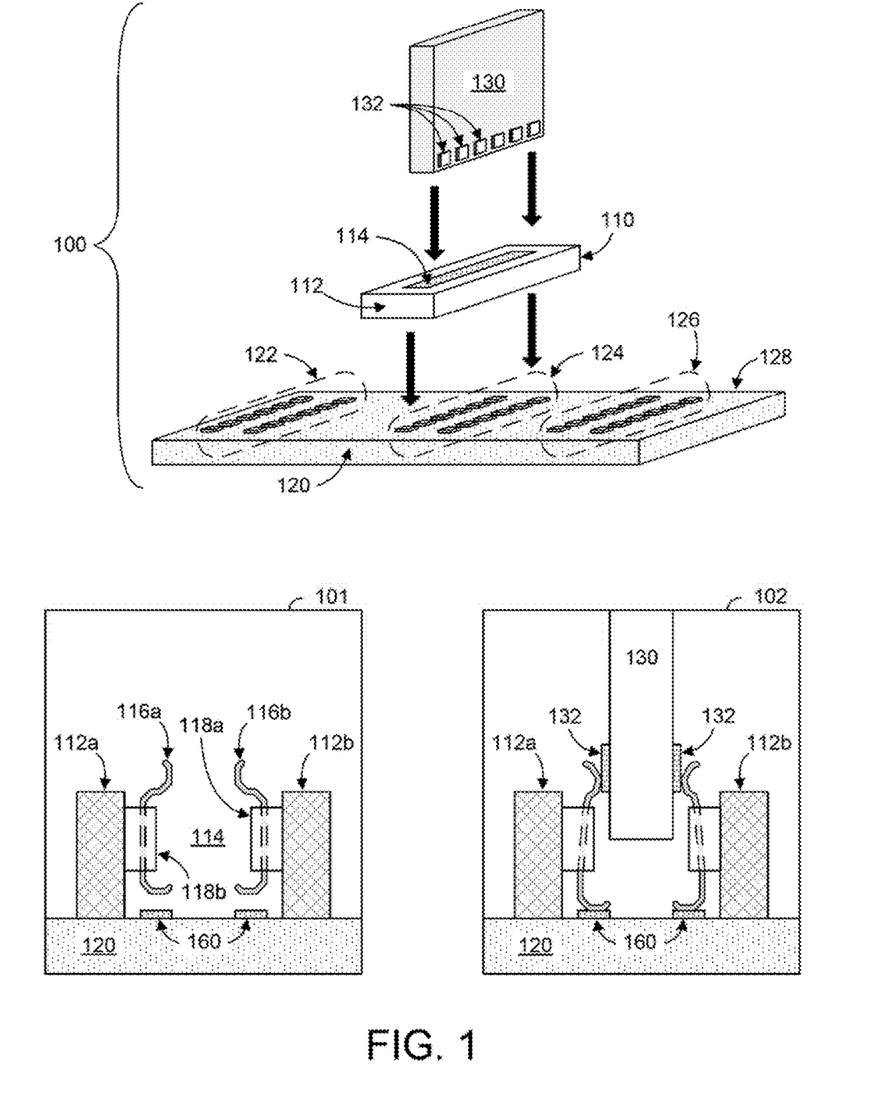
FIG. 1 shows an exploded view and cross-sectional views of a system to provide connectivity to a circuit board according to an embodiment.

FIG. 1 shows and exploded view of a system 100 to provide connectivity to a printed circuit board according to an embodiment. In the illustrative embodiment shown, system 100 includes a substrate 120 having formed therein or thereon various interconnect structures. For example, a side 128 of substrate 120 may have formed therein or thereon a hardware interface 122 by which substrate 120 is to couple to a microelectronic device (not shown). Alternatively or in addition, a hardware interface 124 at side 128 may facilitate connectivity of a device 130 to substrate 120 via a connector 110. Although some embodiments are not limited in this regard, side 128 may also have disposed thereon hardware interface 126 to facilitate connection to still another device (not shown). Substrate 120 may be a PCB which includes a bus (not shown) that interconnects hardware interfaces 122, 124, 126—e.g., wherein respective IO contacts (e.g., conductive pads) of hardware interfaces 122, 124, 126 are variously coupled in series via trace portions of the bus.

In an embodiment, connector 110 includes a housing 112 that forms a recess 114 to receive device 130 at least in part. Structures adjoining recess 114 may facilitate mechanical support of device 130 and/or electrical coupling of device 130 to hardware interface 124. For example, a hardware interface of device 130 may include IO contacts 132 to variously provide electrical connection between circuitry of device 130 and circuitry external to device 130.

Device 130 may be any of a variety of components that, for example, include a printed circuit board and, in some embodiments, integrated circuitry coupled thereto. For example, device 130 may include a PCIe card, a blade server or the like—e.g., where device 130 is to couple edgewise to side 128 via connector 110. In one illustrative embodiment, device 130 includes a DIMM card or other memory unit comprising a printed circuit board and packaged DRAM devices disposed thereon. However, some embodiments are not limited to a particular type of functionality that might be provided by circuitry of device 130.

FIG. 1 also shows cross-sectional side views 101, 102 of system 100 during different respective states of connectivity between device 130 and substrate 120. As shown in view 101, housing 112 (or other such structures of connector 110) may include one or both of housing portions 112a, 112b which define at least in part opposite sides of recess 114. Housing portions 112a, 112b may be variously adhered, soldered or otherwise mechanically secured to substrate 120 at side 128—e.g., wherein IO contacts 160 of hardware interface 124 are positioned between interior sidewalls of housing portions 112a, 112b. Conductors of connector 110—the conductors to function as a hardware interface—may be variously coupled to or decoupled from hardware interface 124 at different times (e.g., in response to device 130 being inserted at least partially into, or removed from, recess 114).

By way of illustration and not limitation, connector 110 may include conductors 116a, 116b anchored to housing portions 112a, 112b respectively. In the illustrative embodiment shown, anchor structure 118a couples conductor 116a to housing portion 112a and anchor structure 118b couples 116b to housing portion 112b. Anchor structures 118a, 118b may comprise any of a variety of structures to at least partially constrain movement of conductors 116a, 116b relative to housing portions 112a, 112b—e.g., where at least some flexion and/or linear motion of conductors 116a, 116b is allowed by anchor structures 118a, 118b. For example, while device 130 is entirely outside of recess 114, conductors 116a, 116b may be positioned and/or otherwise configured to be electrically isolated from hardware interface 124. However, insertion of device 130 into recess 114—e.g., to at least some threshold amount—may cause a positional change of at least part of conductor 116a (or conductor 116b) relative to a corresponding one of the IO contacts of hardware interface 124. As shown in view 102, device 130 may be inserted into recess 114 to bring respective first portions of conductors 116a, 116b each into contact with a corresponding one of IO contacts 132. In response to such insertion, respective second portions of conductors 116a, 116b may be brought into contact each with a corresponding one of the IO contacts 160 of hardware interface 124. A later removal of device 130 from recess 114 may cause conductors 116a, 116b to return to the respective positions shown in view 101. Accordingly, such removal of device 130 may result in bilateral decoupling of the hardware interface which includes conductors 116a, 116b from both the hardware interface which includes IO contacts 160 and the hardware interface which includes IO contacts 132.

Figure 2:
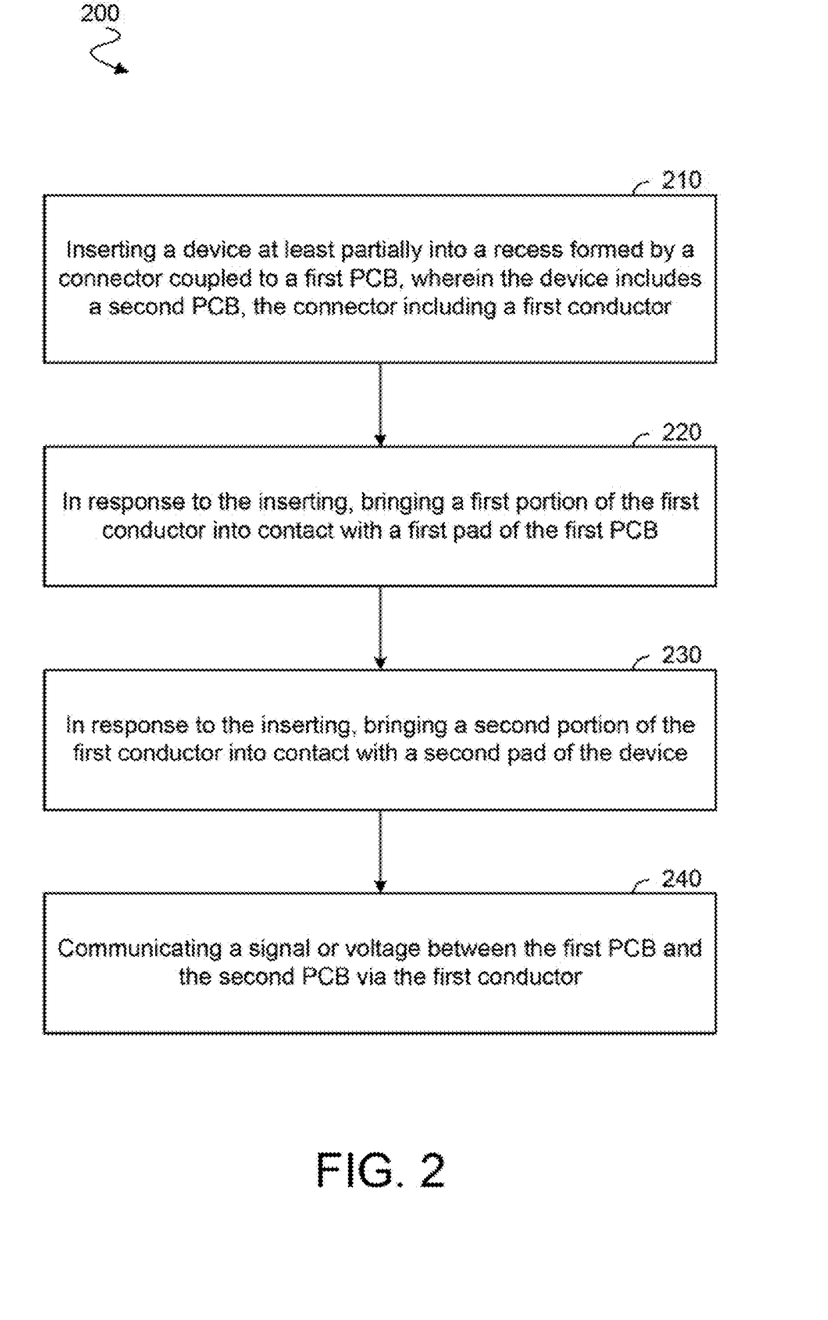
FIG. 2 is a flow diagram illustrating elements of a method to provide connection with a circuit board according to an embodiment.

FIG. 2 illustrates elements of a method 200 to interconnect printed circuit boards according to an embodiment. Method 200 may provide connectivity between structures of system 100, for example. In an embodiment, method 200 includes, at 210, inserting a device at least partially into a recess formed by a connector that is coupled to a side of a first PCB. The recess may be disposed, for example, between a first housing portion of the connector and a second housing portion of the connector. The device may include a second PCB, wherein a hardware interface of the connector is to facilitate interconnection of the first PCB and the second PCB.

A first conductor of the hardware interface—e.g., one of conductors 116a, 116b—may be anchored directly or indirectly with the first housing portion. For example, the first housing portion and the second housing portion (e.g., portions 112a, 112b) may be rigidly coupled to the first PCB, wherein the first housing portion—or another structure of the connector that is rigidly coupled to the first housing portion—is rigidly coupled to a portion of the first conductor. Relative to the first housing portion, motion of a portion of the first conductor may be at least partially constrained—e.g., in at least one dimension—whereas motion of another portion of the first conductor may be enabled. For example, one or more other portions of the first conductor may form a bend or a curve that is configured to deform in response to the at least partial inserting at 210. In another embodiment, the connector may include multiple housings, wherein a motion of the first conductor relative to a first housing is constrained along a given dimension. In such an embodiment, motion of the first conductor and the first housing together, relative to a second housing, may be enabled along that same dimension.

Operations of method 200 may further facilitate interconnection of the first PCB and the second PCB in response to the inserting at 210. For example, in response to such inserting, method 200 may, at 220, bring a first portion of the first conductor into contact with a first pad of the first PCB. In further response to such inserting, method 200 may, at 230, bring a second portion of the first conductor into contact with a second pad of the device.

In an embodiment, any subsequent removal of the device from the recess may decouple the first conductor both from the first pad of the first PCB and from the second pad of the device. Such decoupling (in this context, referred to herein as "bi-lateral decoupling") may electrically isolate the first conductor from a signal trace of a bus or other interconnect that is coupled to the first pad. This electrical isolation may be concurrent with housing and/or other structures of the connector being connected to the side of the first PCB.

Alternatively or in addition, method 200 may include operation of circuitry that is interconnected by earlier processes such as that at 210, 220, 230. For example, method 200 may include, at 240, communicating a signal or voltage between the first PCB and the second PCB via the first conductor. The first PCB may comprise multiple other hardware interfaces—e.g., wherein the hardware interfaces are coupled to one another by a shared bus.

Figure 3:
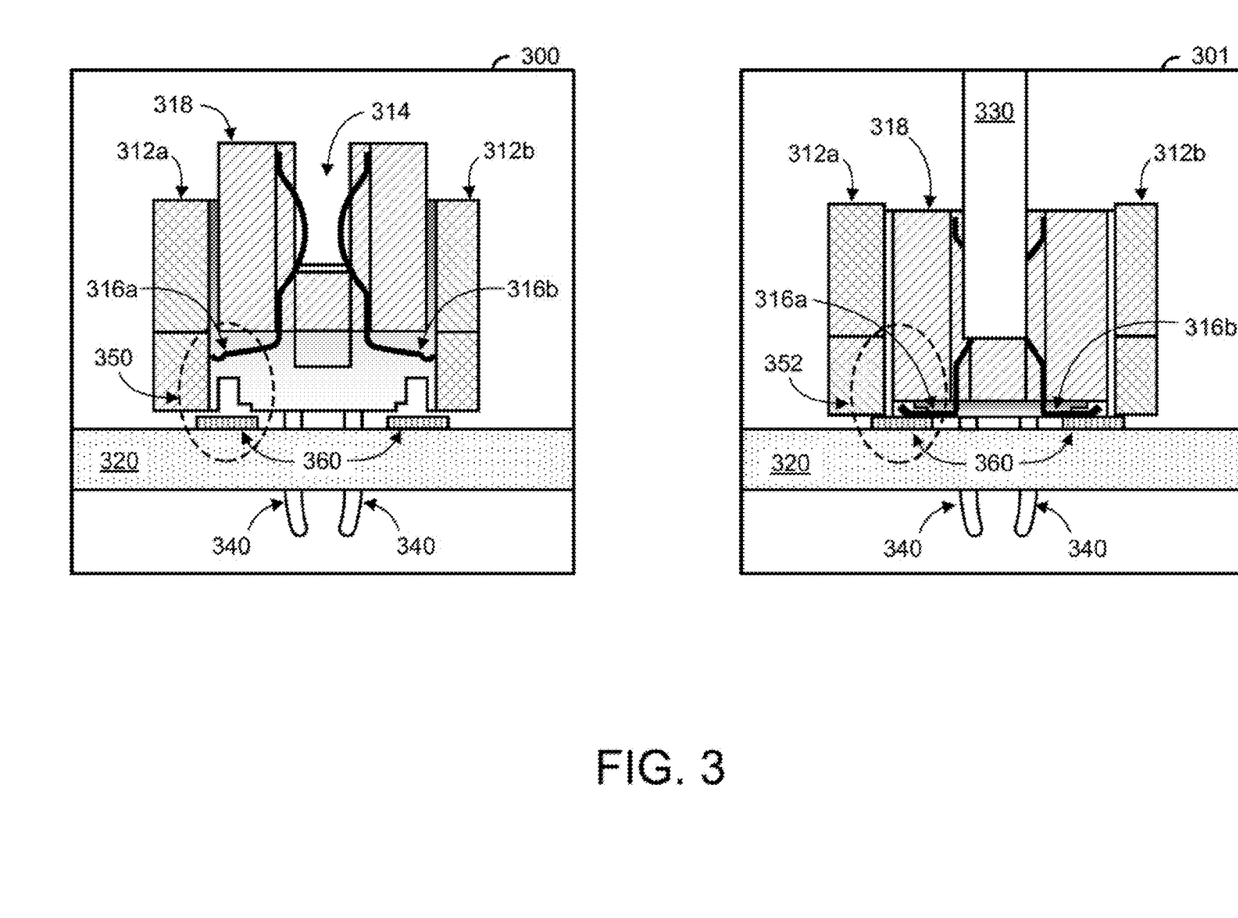
FIG. 3 shows cross-sectional side views of a connector device according to an embodiment.

FIG. 3 shows cross-sectional views 300, 301 of a system to provide connectivity between printed circuit boards according to an embodiment. The system variously shown in views 300, 301 may include some or all of the features of system 100, for example. View 300 shows a connector, according to an embodiment, that is coupled at a side of a substrate 320 such as a first PCB. The connector is configured to receive a second printed circuit board for edgewise connection to substrate 320. In an embodiment, the connector includes housing portions 312a, 312b, wherein a recess 314 is disposed there between. Housing portions 312a, 312b may be different respective portions of the same first housing—e.g., wherein the connector further comprises housing a second housing portion 318. Housing portions 312a, 312b may provide rigid coupling of the connector at a side of substrate 320. By way of illustration and not limitation, supports 340 may extend from a bottom of the first housing and at least partially into (for example, through) substrate 320. Alternatively or in addition, the first housing and/or other structures of the connector may be glued, soldered or otherwise rigidly coupled to substrate 320.

As shown in view 300, a connector according to an embodiment may include one or more interconnect structures (such as the illustrative conductors 316a, 316b) which are each anchored to at least partially constrain movement thereof. For example, conductors 316a, 316b may be glued, clamped and/or otherwise constrained to move with housing portion 318. In such an embodiment, housing portion 318 may be spring loaded or otherwise configured to allow for movement of housing portion 318 relative to housing portions 312a, 312b and substrate 320. Such movement may allow for conductors 316a, 316b each to move relative to a corresponding one of IO contacts 360 variously disposed each at a side of substrate 320. For example, as shown by region 350 in view 300, conductor 316a may be decoupled (e.g., electrically isolated) from one of IO contacts 360 when housing portion 318 is in a default uncompressed state; however, as shown at view 301, housing portion 318 may be subsequently compressed or otherwise transitioned to a recessed state—e.g., in response to an insertion of a PCB 330 into recess 314. Such transitioning to the recessed state may move housing portion 318 toward IO contacts 360 of substrate 320. As a result, one or both of conductors 316a, 316b may be brought into contact each with a respective one of IO contacts 360 (as shown in the illustrative region 352).

Figure 4:
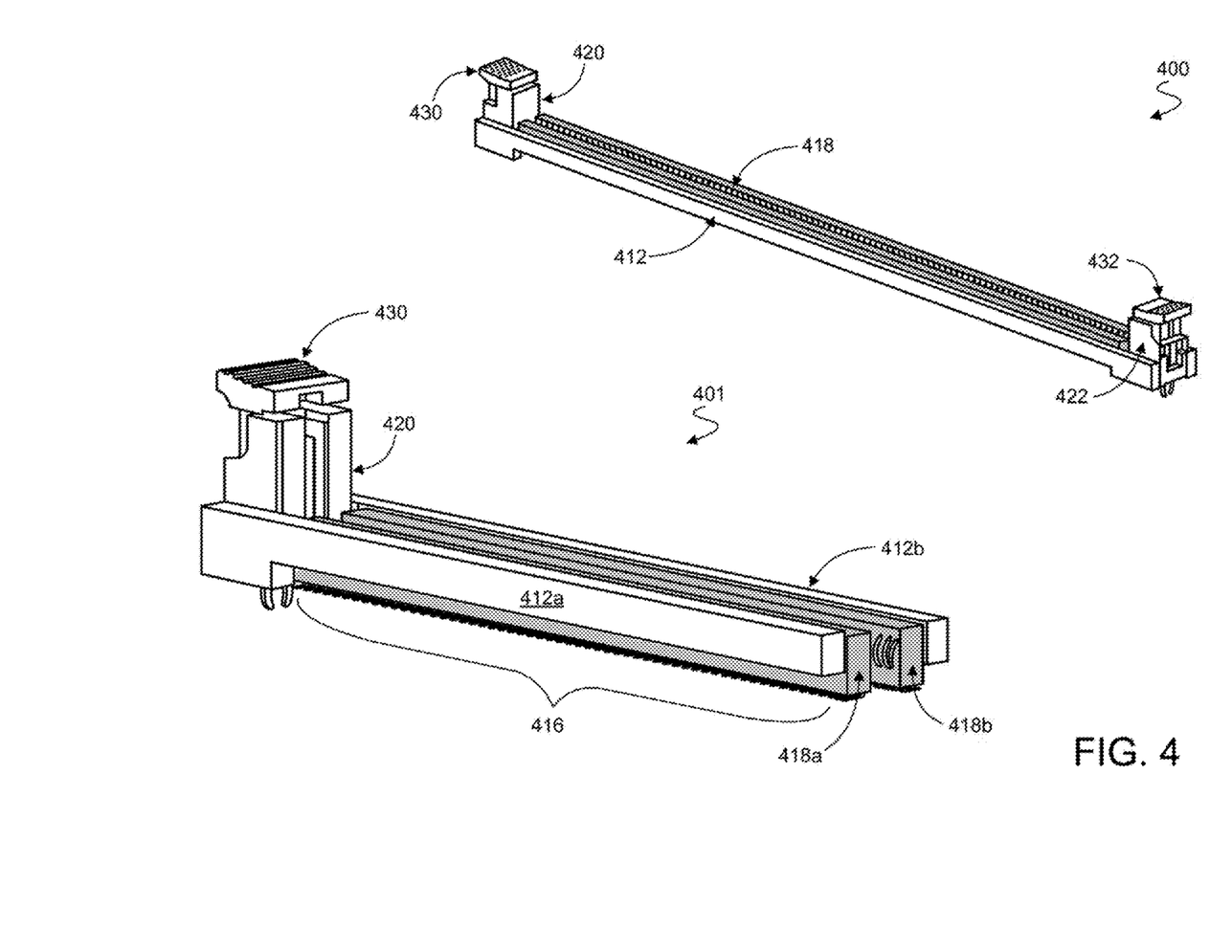
FIG. 4 shows perspective views of a connector device according to an embodiment.

FIG. 4 shows features of a connector 400 to provide connectivity to printed circuit boards according to embodiment. Connector 400 may include features of connector 110 or the connector shown in view 300, for example. In an embodiment coupling of printed circuit boards via connector 400 is performed according to method 200.

In the illustrative embodiment shown, connector 400 includes first housing 412, wherein a second housing 418 of connector 400 is disposed in a recessed region extending through first housing 412. First housing 412 and second housing 418 make each extend between spring mount 420 and spring mount 422—e.g., where one or both of spring mounts 420, 422 have disposed therein respective mechanisms to facilitate movement of housings 412, 418 relative to one another. By way of illustration and not limitation, spring mount 420 and/or spring mount 422 may include one or more spring loaded mechanisms to resist depression of second housing 418 (e.g., to facilitate ejection of a printed circuit board from connector 400). Levers 430, 432 may facilitate locking of a printed circuit board into the recess formed by second housing 418 and/or spring mount 420.

As shown in the cross-sectional detail view 401 of connector 400, first housing 412 may include housing portions 412a, 412b, which define at least in part opposite sides of a recess in which is disposed second housing 418. In turn, second housing 418 may comprise housing portions 418a, 418b disposed to opposite one another. A hardware interface 416 of connector 400 may include connectors that are variously anchored with housing portions 418a, 418b—e.g., wherein the conductors are at least partially constrained mechanically by housing portions 418a, 418b, but wherein the conductors may move, together with housing portion 418a and housing portion 418b, relative to housing portions 412a, 412b. Such movement may facilitate bilateral coupling and/or decoupling of some or all conductors of hardware interface 416. Housings 412, 418, hardware interface 416 and other structures of connector 400 may be formed by respective materials adapted from conventional techniques for fabricating connector hardware. By way of illustration and not limitation, housings 412, 418 may include any of a variety of extruded plastic structures, and conductors of hardware interface 416 may include copper and/or any of a variety of other metals used in conventional connector pins.

Figure 5:
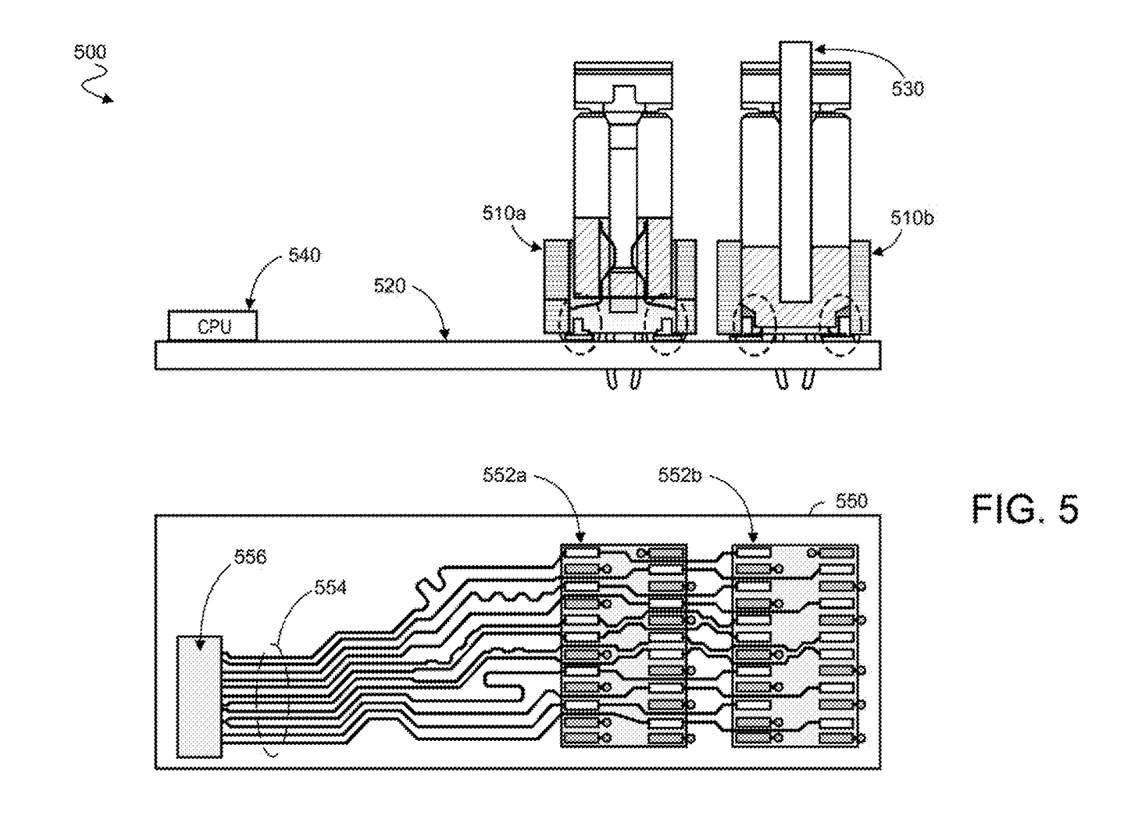
FIG. 5 shows plan views of a system to provide connectivity with a printed circuit board according to an embodiment.

FIG. 5 illustrates elements of a system 500 to provide connectivity between printed circuit boards according to an embodiment. System 500 may include some or all of the features of system 100, for example. In an embodiment, connectivity is provided by system 500 according to method 200—e.g., using connector structures such as those shown in FIG. 3 or FIG. 4. System 500 is one example of an embodiment wherein a connector is to be disposed on a substrate having formed therein or thereon multiple hardware interfaces, the hardware interfaces coupled in series with each other via a shared bus. Signal noise on the shared bus may be mitigated by one or more connectors that facilitate, each according to a corresponding embodiment, a bilateral decoupling of respective hardware interface structures.

The illustrative embodiment of system 500 includes a PCB 520 having formed therein or thereon a hardware interface 556 to couple PCB 520 to a host, such as the illustrative central processor unit (CPU) 540 shown. As shown in top plan view 550 of system 500, a bus 554 of PCB 520 may include conductive traces that variously extend to interconnect hardware interface 556 with other hardware interfaces 552a, 552b of PCB 520. To enable coupling of PCB 520 with one or more other devices (such as the illustrative DIMM 530 shown), system 500 may further comprise connectors 510a, 510b that are disposed at hardware interfaces 552a, 552b, respectively. One or both of connectors 510a, 510b may include features of connector 110 and/or connector 400, for example. Signal noise on bus 554 may be mitigated by one or both of connectors 510a, 510b providing bilateral decoupling of respective hardware interface structures. For example, a hardware interface of connector 510b may include conductors that are configured to be variously coupled to (or decoupled from) corresponding IO pads of hardware interface 552b—e.g., based on DIMM 530 being interted into (or removed from) connector 510b.

Figure 6:
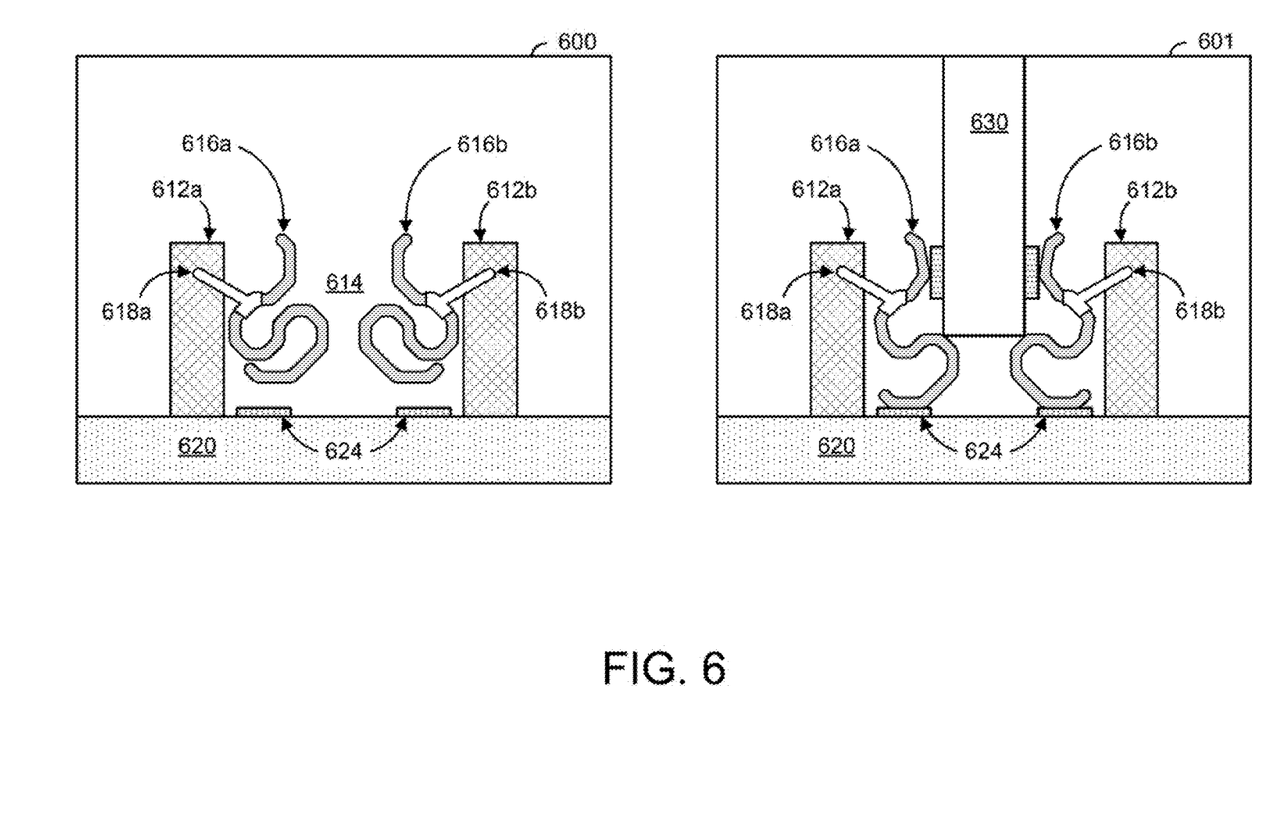
FIG. 6 shows cross-sectional side views of a connector device according to an embodiment.

FIG. 6 shows cross-sectional side views 600, 601 of a system, according to an embodiment, during different respective states of connectivity between a device 630 and a substrate 620. The system variously shown in views 600, 601 may include some or all of the features of system 100. Connectivity may be provided by the system according to method 200, for example.

As shown in view 600, housing portions 612a, 612b of a connector (e.g., one of connectors 110, 400) may define at least in part opposite sides of recess 614, wherein housing portions 612a, 612b are rigidly coupled to a side of substrate 620. A hardware interface of substrate 620 may include pads 624 which are positioned between interior sidewalls of housing portions 612a, 612b—e.g., under recess 614. A hardware interface of connector 610 may include conductors 616a, 616b which are each to variously coupled to and decouple from a respective one of pads 624 (e.g., in response to device 630 being inserted at least partially into, or removed from, recess 614).

In the illustrative embodiment shown, anchor structure 618a couples conductor 616a to housing portion 612a and anchor structure 618b couples 616b to housing portion 612b. Anchor structures 618a, 618b may comprise any of a variety of structures to at least partially constrain movement of conductors 616a, 616b relative to housing portions 612a, 612b. For example, while device 630 is entirely outside of recess 614, portions of conductors 616a, 616b may variously form respective curved, angled or otherwise non-linear shapes. Concurrently, conductors 616a, 616b may be electrically isolated from pads 624.

However, as shown in view 601, insertion of device 630 into recess 614—e.g., to at least some threshold amount—may result in device 630 coming into contact with one or both of conductors 616a, 616b. In response to such contact, non-linear portions of conductors 616a, 616b may deform to variously bring conductors 616a, 616b each into direct contact with a respective one of pads 624. Accordingly, insertion of device 630 into recess 614 may result in bilateral coupling of the hardware interface which includes conductors 616a, 616b to both a hardware interface at substrate 620 and a hardware interface of device 630. A later removal of device 630 may cause conductors 616a, 616b to return to the respective shapes shown in view 600. Accordingly, the removal of device 630 may result in bilateral decoupling from both the hardware interface at substrate 620 and the hardware interface of device 630.

Figure 7:
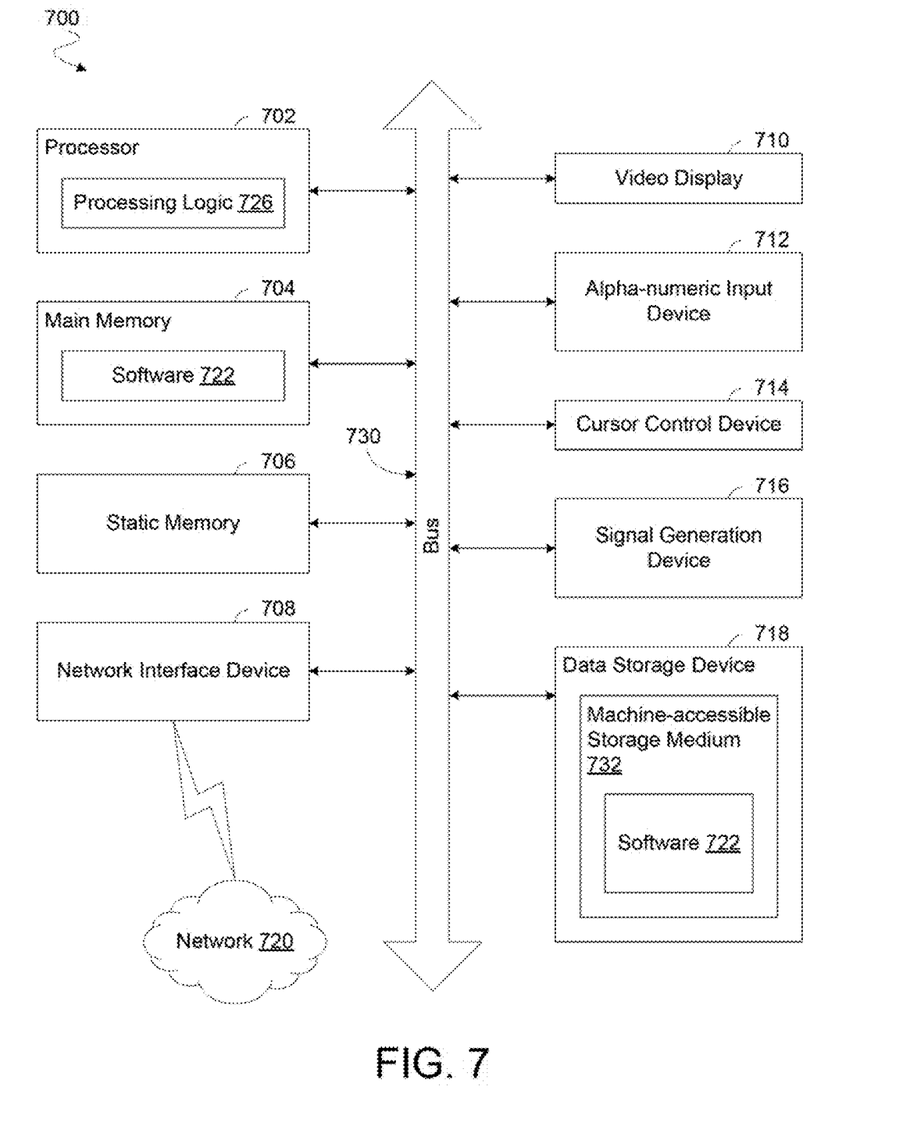
FIG. 7 is a functional block diagram illustrating elements of an exemplary computer system, in accordance with an embodiment.

FIG. 7 illustrates a diagrammatic representation of a machine in the exemplary form of a computer system 700 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 700 includes a processor 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a secondary memory 718 (e.g., a data storage device), which communicate with each other via a bus 730.

Processor 702 represents one or more general-purpose processing devices such as a microprocessor, central processing unit, or the like. More particularly, the processor 702 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 702 may also be one or more special-purpose processing devices such as an application specific integrated circuit (ASIC), a field programmable gate array (FPGA), a digital signal processor (DSP), network processor, or the like. Processor 702 is configured to execute the processing logic 726 for performing the operations described herein.

The computer system 700 may further include a network interface device 708. The computer system 700 also may include a video display unit 710 (e.g., a liquid crystal display (LCD), a light emitting diode display (LED), or a cathode ray tube (CRT)), an alphanumeric input device 712 (e.g., a keyboard), a cursor control device 714 (e.g., a mouse), and a signal generation device 716 (e.g., a speaker).

The secondary memory 718 may include a machine-accessible storage medium (or more specifically a computer-readable storage medium) 732 on which is stored one or more sets of instructions (e.g., software 722) embodying any one or more of the methodologies or functions described herein. The software 722 may also reside, completely or at least partially, within the main memory 704 and/or within the processor 702 during execution thereof by the computer system 700, the main memory 704 and the processor 702 also constituting machine-readable storage media. The software 722 may further be transmitted or received over a network 720 via the network interface device 708.

While the machine-accessible storage medium 732 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any of one or more embodiments. The term "machine-readable storage medium" shall accordingly be taken to include, but not be limited to, solid-state memories, and optical and magnetic media.

Figure 8:
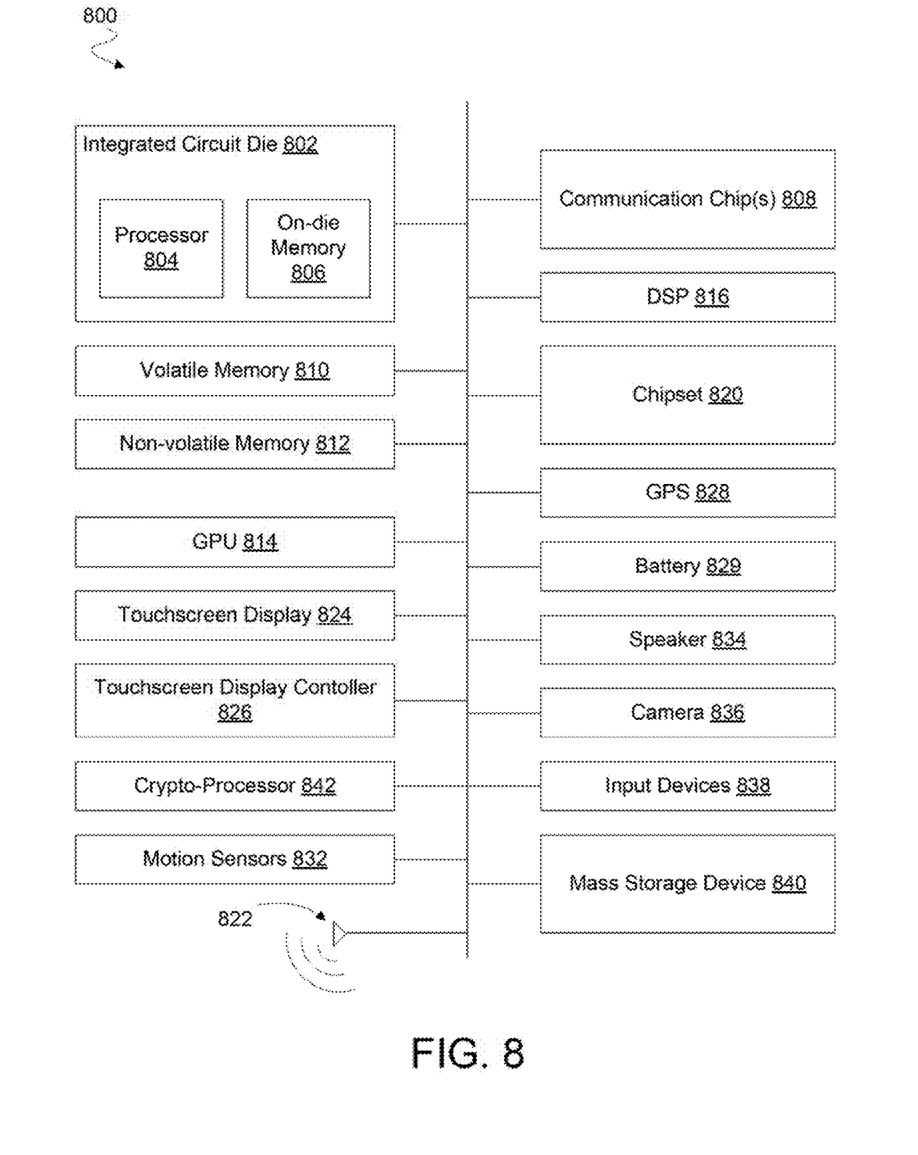
FIG. 8 is a functional block diagram illustrating elements of an exemplary computer device, in accordance with an embodiment.

FIG. 8 illustrates a computing device 800 in accordance with one embodiment. The computing device 800 may include a number of components. In one embodiment, these components are attached to one or more motherboards. In an alternate embodiment, these components are fabricated onto a single system-on-a-chip (SoC) die rather than a motherboard. The components in the computing device 800 include, but are not limited to, an integrated circuit die 802 and at least one communication chip 808. In some implementations the communication chip 808 is fabricated as part of the integrated circuit die 802. The integrated circuit die 802 may include a CPU 804 as well as on-die memory 806, often used as cache memory, that can be provided by technologies such as embedded DRAM (eDRAM) or spin-transfer torque memory (STTM or STTM-RAM).

Computing device 800 may include other components that may or may not be physically and electrically coupled to the motherboard or fabricated within an SoC die. These other components include, but are not limited to, volatile memory 810 (e.g., DRAM), non-volatile memory 812 (e.g., ROM or flash memory), a graphics processing unit 814 (GPU), a digital signal processor 816, a crypto processor 842 (a specialized processor that executes cryptographic algorithms within hardware), a chipset 820, an antenna 822, a display or a touchscreen display 824, a touchscreen controller 826, a battery 829 or other power source, a power amplifier (not shown), a global positioning system (GPS) device 828, a compass 830, a motion coprocessor or sensors 832 (that may include an accelerometer, a gyroscope, and a compass), a speaker 834, a camera 836, user input devices 838 (such as a keyboard, mouse, stylus, and touchpad), and a mass storage device 840 (such as hard disk drive, compact disk (CD), digital versatile disk (DVD), and so forth).

The communications chip 808 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 808 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 800 may include a plurality of communication chips 808. For instance, a first communication chip 808 may be dedicated to shorter range wireless communications such as Wi-Fi and Bluetooth and a second communication chip 808 may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory. In various embodiments, the computing device 800 may be a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data.

In one implementation, a connector comprises a first housing portion and a second housing portion configured to be coupled to a side of a first printed circuit board (PCB), wherein a recess is disposed between the first housing portion and the second housing portion. The connector further comprises a hardware interface configured to interconnect the first printed circuit board with a second printed circuit board, the hardware interface including a first conductor anchored directly or indirectly with the first housing portion, the first conductor including a first conductor portion configured to move relative to the first housing portion and the second housing portion in response to an at least partial insertion of a device into the recess, the device including the second printed circuit board, and a second conductor portion configured to be brought into contact with a conductive pad of a device.

In one embodiment, the connector further comprises a third housing portion and a fourth housing portion, wherein the recess is disposed between the third housing portion and the fourth housing portion, wherein the first conductor is rigidly coupled to the third housing portion, and wherein, of a first dimension and a second dimension, movement of the third housing portion relative to the first housing portion is restricted only along the first dimension. In another embodiment, the connector further comprises a spring loaded actuator to control movement of the third housing portion relative to the first housing portion. In another embodiment, the first PCB comprises a first hardware interface, a second hardware interface and a bus interconnecting the first hardware interface and the second hardware interface. In another embodiment, the first PCB further comprises a third hardware interface coupled to the first hardware interface and the second hardware interface via the bus, wherein the first hardware interface is coupled between the second hardware interface and the third hardware interface, the first hardware interface including the first pad.

In another embodiment, the first conductor forms a bend or a curve configured to deform in response to the at least partial insertion of the device into the recess. In another embodiment, the hardware interface further comprises a plurality of conductors each anchored directly or indirectly with a respective one of the first housing portion and the second housing portion, wherein for each of the plurality of conductors, the conductor including a respective first conductor portion configured to move relative to the first housing portion and the second housing portion in response to the at least partial insertion of the device into the recess, and a respective second conductor portion configured to be brought into contact with a respective conductive pad of a device. In another embodiment, a first housing of the connector includes the first housing portion and the second housing portion.

In another implementation, a system comprises a first printed circuit board (PCB) and a connector including a first housing portion and a second housing portion each coupled to a side of a first PCB, wherein a recess is disposed between the first housing portion and the second housing portion. The connector further comprises a hardware interface configured to interconnect the first printed circuit board with a second printed circuit board, the hardware interface including a first conductor anchored directly or indirectly with the first housing portion, the first conductor including a first conductor portion configured to move relative to the first housing portion and the second housing portion in response to an at least partial insertion of a device into the recess, the device including the second printed circuit board, and a second conductor portion configured to be brought into contact with a conductive pad of a device. The system further comprises a display coupled to the first PCB, the display to generate an image based on a communication between the first PCB and the second PCB.

In one embodiment, the connector further comprises a third housing portion and a fourth housing portion, wherein the recess is disposed between the third housing portion and the fourth housing portion, wherein the first conductor is rigidly coupled to the third housing portion, and wherein, of a first dimension and a second dimension, movement of the third housing portion relative to the first housing portion is restricted only along the first dimension. In another embodiment, the connector further comprises a spring loaded actuator to control movement of the third housing portion relative to the first housing portion. In another embodiment, the first PCB comprises a first hardware interface, a second hardware interface and a bus interconnecting the first hardware interface and the second hardware interface. In another embodiment, the first PCB further comprises a third hardware interface coupled to the first hardware interface and the second hardware interface via the bus, wherein the first hardware interface is coupled between the second hardware interface and the third hardware interface, the first hardware interface including the first pad.

In another embodiment, the first conductor forms a bend or a curve configured to deform in response to the at least partial insertion of the device into the recess. In another embodiment, the hardware interface further comprises a plurality of conductors each anchored directly or indirectly with a respective one of the first housing portion and the second housing portion, wherein for each of the plurality of conductors, the conductor including a respective first conductor portion configured to move relative to the first housing portion and the second housing portion in response to the at least partial insertion of the device into the recess, and a respective second conductor portion configured to be brought into contact with a respective conductive pad of a device. In another embodiment, a first housing of the connector includes the first housing portion and the second housing portion.

In another implementation, a method comprises inserting a device at least partially into a recess disposed between a first housing portion of a connector and a second housing portion of the connector, wherein the connector is coupled to a side of a first printed circuit board (PCB), wherein the device includes a second PCB, and wherein a hardware interface of the connector includes a first conductor anchored directly or indirectly with the first housing portion. The method further comprises, in response to the inserting, interconnecting the first PCB and the second PCB, including bringing a first portion of the first conductor into contact with a first pad of the first PCB, and bringing a second portion of the first conductor into contact with a second pad of the device.

In another embodiment, the method further comprises communicating a signal or voltage between the first PCB and the second PCB via the first conductor. In another embodiment, the connector further comprises a third housing portion and a fourth housing portion, wherein the recess is disposed between the third housing portion and the fourth housing portion, wherein the first conductor is rigidly coupled to the third housing portion, and wherein, of a first dimension and a second dimension, movement of the third housing portion relative to the first housing portion is restricted only along the first dimension. In another embodiment, in response to the inserting, the third housing portion and the fourth housing portion move relative to the first housing portion and the second housing portion.

In another embodiment, the first PCB comprises a first hardware interface, a second hardware interface and a bus interconnecting the first hardware interface and the second hardware interface. In another embodiment, the first PCB further comprises a third hardware interface coupled to the first hardware interface and the second hardware interface via the bus, wherein the first hardware interface is coupled between the second hardware interface and the third hardware interface, the first hardware interface including the first pad. In another embodiment, the first conductor forms a bend or a curve configured to deform in response to the at least partial insertion of the device into the recess. In another embodiment, the hardware interface further comprises a plurality of conductors each anchored directly or indirectly with a respective one of the first housing portion and the second housing portion, wherein for each of the plurality of conductors, the conductor includes a respective first conductor portion configured to move relative to the first housing portion and the second housing portion in response to the at least partial insertion of the device into the recess, and a respective second conductor portion configured to be brought into contact with a respective conductive pad of a device. In another embodiment, a first housing of the connector includes the first housing portion and the second housing portion.

Techniques and architectures for facilitating connectivity with a circuit board are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. A connector comprising:
a first housing portion and a second housing portion configured to be coupled to a side of a first printed circuit board (PCB), wherein a recess is disposed between the first housing portion and the second housing portion, the recess to receive a device including a second PCB, wherein the connector is to be coupled between the first PCB and the device;
a hardware interface configured to interconnect the first PCB with the second PCB, the hardware interface including a first conductor anchored directly or indirectly with the first housing portion, the first conductor including:
a first conductor portion configured to move relative to the first housing portion and the second housing portion, in response to an at least partial insertion of the device into the recess, to bring the first conductor portion into direct contact with a first conductive pad of the first PCB; and
a second conductor portion configured to be brought into direct contact with a second conductive pad of the device in response to the at least partial insertion of the device into the recess, wherein the connectors comprises
a third housing protion; and
a fourth housing portion, wherein the recess is disposed between the third housing portion and the fourth housing portion, wherein the first conductor is rigidly coupled to the third housing portion, and wherein, of a first dimension and a second dimension, movement of the third housing portion relative to the first housing portion is restricted only along the first dimension.

2. The connector of claim 1, further comprising a spring loaded actuator to control movement of the third housing portion relative to the first housing portion.

3. The connector of claim 1, wherein the first PCB comprises a first hardware interface, a second hardware interface and a bus interconnecting the first hardware interface and the second hardware interface.

4. The connector of claim 3, wherein the first PCB further comprises a third hardware interface coupled to the first hardware interface and the second hardware interface via the bus, wherein the first hardware interface is coupled between the second hardware interface and the third hardware interface, the first hardware interface including the first conductive pad.

5. The connector of claim 1, wherein the first conductor forms a bend or a curve configured to deform in response to the at least partial insertion of the device into the recess.

6. The connector of claim 1, the hardware interface further comprising a plurality of conductors each anchored directly or indirectly with a respective one of the first housing portion and the second housing portion, wherein for each of the plurality of conductors, the conductor including:
a respective first conductor portion configured to move relative to the first housing portion and the second housing portion in response to the at least partial insertion of the device into the recess; and
a respective second conductor portion configured to be brought into direct contact with a respective conductive pad of the device.

7. The connector of claim 1, wherein a first housing of the connector includes the first housing portion and the second housing portion.

8. A system comprising:
a first printed circuit board (PCB);
a connector including:
a first housing portion and a second housing portion each coupled to a side of the first PCB, wherein a recess is disposed between the first housing portion and the second housing portion, the recess to receive a device including a second PCB, wherein the connector is to be coupled between the first PCB and the device; and
a hardware interface configured to interconnect the first PCB with the second PCB, the hardware interface including a first conductor anchored directly or indirectly with the first housing portion, the first conductor including:
a first conductor portion configured to move relative to the first housing portion and the second housing portion in response to an at least partial insertion of the device into the recess, to bring the first conductor portion into direct contact with a first conductive pad of the first PCB; and
a second conductor portion configured to be brought into direct contact with a second conductive pad of the device in response to the at least partial insertion of the device into the recess, wherein the connector comprises
a third housing portion and a fourth housing portion, wherein the recess is disposed between the third housing portion and the fourth housing portion, wherein the first conductor is rigidly coupled to the third housing portion, and wherein, of a first dimension and a second dimension, movement of the third housing portion relative to the first housing portion is restricted only along the first dimension; and
a display coupled to the first PCB, the display to generate an image based on a communication between the first PCB and the second PCB.

9. The system of claim 8, wherein the first PCB comprises a first hardware interface, a second hardware interface and a bus interconnecting the first hardware interface and the second hardware interface.

10. The system of claim 9, the first PCB further comprising a third hardware interface coupled to the first hardware interface and the second hardware interface via the bus, wherein the first hardware interface is coupled between the second hardware interface and the third hardware interface, the first hardware interface including the first conductive pad.

11. The system of claim 8, wherein the first conductor forms a bend or a curve configured to deform in response to the at least partial insertion of the device into the recess.

12. The system of claim 8, the hardware interface further comprising a plurality of conductors each anchored directly or indirectly with a respective one of the first housing portion and the second housing portion, wherein for each of the plurality of conductors, the conductor including:

a respective first conductor portion configured to move relative to the first housing portion and the second housing portion in response to the at least partial insertion of the device into the recess; and a respective second conductor portion configured to be brought into direct contact with a respective conductive pad of the device.

13. A method comprising:

inserting a device at least partially into a recess disposed between a first housing portion of a connector and a second housing portion of the connector, wherein the connector is coupled to a side of a first printed circuit board (PCB), wherein the device includes a second PCB, and wherein a hardware interface of the connector includes a first conductor anchored directly or indirectly with the first housing portion;

in response to the inserting, interconnecting the first PCB and the second PCB, including:

bringing a first portion of the first conductor into direct contact with a first conductive pad of the first PCB; and bringing a second portion of the first conductor into direct contact with a second conductive pad of the device, wherein after the inserting, the connector is coupled between the first PCB and the device, wherein the connector comprises a third housing portion and a fourth housing portion, wherein the recess is disposed between the third housing portion and the fourth housing portion, wherein the first conductor is rigidly coupled to the third housing portion, and wherein, of a first dimension and a second dimension, movement of the third housing portion relative to the first housing portion is restricted only along the first dimension.

14. The method of claim 13, further comprising communicating a signal or voltage between the first PCB and the second PCB via the first conductor.

15. The method of claim 13, wherein the first PCB comprises a first hardware interface, a second hardware interface and a bus interconnecting the first hardware interface and the second hardware interface.

16. The method of claim 13, wherein the first conductor forms a bend or a curve configured to deform in response to the at least partial insertion of the device into the recess.

17. The method of claim 13, wherein the hardware interface further comprises a plurality of conductors each anchored directly or indirectly with a respective one of the first housing portion and the second housing portion, wherein for each of the plurality of conductors, the conductor includes:

a respective first conductor portion configured to move relative to the first housing portion and the second housing portion in response to the at least partial insertion of the device into the recess; and a respective second conductor portion configured to be brought into direct contact with a respective conductive pad of the device.

* * * * *